US011283233B2

(12) United States Patent
Sato et al.

(10) Patent No.: US 11,283,233 B2
(45) Date of Patent: Mar. 22, 2022

(54) METHOD OF FABRICATING SEMICONDUCTOR LIGHT-EMITTING DEVICE AND SEMICONDUCTOR LIGHT-EMITTING DEVICE

(71) Applicant: Panasonic Intellectual Property Management Co., Ltd., Osaka (JP)

(72) Inventors: Hitoshi Sato, Toyama (JP); Kazuya Yamada, Toyama (JP); Hiroki Nagai, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 148 days.

(21) Appl. No.: 16/777,707

(22) Filed: Jan. 30, 2020

(65) Prior Publication Data
US 2020/0169058 A1 May 28, 2020

Related U.S. Application Data

(63) Continuation of application No. PCT/JP2018/028841, filed on Aug. 1, 2018.

(30) Foreign Application Priority Data

Aug. 4, 2017 (JP) .............................. JP2017-151626

(51) Int. Cl.
*H01S 5/02* (2006.01)
*H01S 5/028* (2006.01)
(Continued)

(52) U.S. Cl.
CPC .......... *H01S 5/0202* (2013.01); *B28D 5/0011* (2013.01); *H01L 33/0062* (2013.01);
(Continued)

(58) Field of Classification Search
CPC ......... H01S 5/22; H01S 5/0282; H01S 5/0202
See application file for complete search history.

(56) References Cited

U.S. PATENT DOCUMENTS

2009/0267100 A1* 10/2009 Miyake ............... H01L 29/2003
257/98
2011/0235497 A1 9/2011 Ogata et al.

FOREIGN PATENT DOCUMENTS

JP H08-172238 A 7/1996
JP 2001-284291 A 10/2001
(Continued)

OTHER PUBLICATIONS

International Search Report issued in corresponding International Patent Application No. PCT/JP2018/028841, dated Oct. 30, 2018, with English translation.

*Primary Examiner* — Michael Carter
(74) *Attorney, Agent, or Firm* — McDermott Will & Emery LLP

(57) ABSTRACT

A method of fabricating a semiconductor light-emitting device includes: (a) forming a semiconductor layer including a light-emitting layer on the first surface of a substrate; (b) forming a first trench and a second trench in the semiconductor layer, the first trench extending in a first direction that is parallel to a principal plane of the substrate, and the second trench being disposed inside and parallel to the first trench; (c) forming a third trench parallel to the first trench in the second surface of the substrate opposite to the first surface of the substrate; and (d) forming a semiconductor light-emitting device by dividing the substrate. In (d), an end of at least one divided side of the semiconductor light-emitting device is in the second trench. The first trench has a first width, and the second trench has a second width. The second width is less than the first width.

22 Claims, 12 Drawing Sheets

(51) Int. Cl.
  *H01S 5/22* (2006.01)
  *H01S 5/343* (2006.01)
  *H01L 33/00* (2010.01)
  *H01L 33/16* (2010.01)
  *H01L 33/44* (2010.01)
  *B28D 5/00* (2006.01)
  *H01S 5/042* (2006.01)
  *H01S 5/32* (2006.01)
  *H01L 21/3065* (2006.01)
  *H01L 33/30* (2010.01)

(52) U.S. Cl.
  CPC ............... *H01L 33/16* (2013.01); *H01L 33/44* (2013.01); *H01S 5/0203* (2013.01); *H01S 5/0206* (2013.01); *H01S 5/028* (2013.01); *H01S 5/0282* (2013.01); *H01S 5/22* (2013.01); *H01S 5/3432* (2013.01); *H01S 5/34353* (2013.01); *B28D 5/0023* (2013.01); *H01L 21/3065* (2013.01); *H01L 33/30* (2013.01); *H01S 5/04252* (2019.08); *H01S 5/3202* (2013.01); *H01S 2301/176* (2013.01); *H01S 2304/04* (2013.01)

(56) References Cited

FOREIGN PATENT DOCUMENTS

| | | |
|---|---|---|
| JP | 2007-165760 A | 6/2007 |
| JP | 2010-199139 A | 9/2010 |
| JP | 2011-077418 A | 4/2011 |
| JP | 2011-227980 A | 11/2011 |

* cited by examiner

METHOD OF FABRICATING SEMICONDUCTOR LIGHT-EMITTING DEVICE AND SEMICONDUCTOR LIGHT-EMITTING DEVICE

CROSS REFERENCE TO RELATED APPLICATIONS

This application is a U.S. continuation application of PCT International Patent Application Number PCT/JP2018/028841 filed on Aug. 1, 2018, claiming the benefit of priority of Japanese Patent Application Number 2017-151626 filed on Aug. 4, 2017, the entire contents of which are hereby incorporated by reference.

BACKGROUND

1. Technical Field

The present disclosure relates to a method of fabricating a semiconductor light-emitting device and the semiconductor light-emitting device.

2. Description of the Related Art

Semiconductor light-emitting devices, such as a semiconductor laser device, are conventionally known. Typically, a semiconductor light-emitting device is fabricated by dividing a substrate in which semiconductor layers including a light-emitting layer are formed (see e.g., Japanese Unexamined Patent Application Publication No. 2011-77418). In the method of fabricating a semiconductor device disclosed in Japanese Unexamined Patent Application Publication No. 2011-77418, semiconductor layers are formed after first trenches are formed in the top of a substrate. Next, by performing dry etching on the first trenches, second trenches having a V-shaped cross section are formed. Then, the substrate is divided by pushing a blade against the bottom of the substrate. These steps are taken to divide the substrate at a desired position.

SUMMARY

In the method of fabricating a semiconductor device disclosed in Japanese Unexamined Patent Application Publication No. 2011-77418, by forming the second trenches having the V-shaped cross section, it is possible to divide the substrate at a desired position of the top of the substrate. However, the substrate may not be divided at a desired position of the bottom of the substrate.

The present disclosure has been made in view of the above problem, and an object of the present disclosure is to provide a method of fabricating a semiconductor light-emitting device, in which it is possible to divide a substrate at a desired position and the semiconductor light-emitting device.

To achieve the above object, a method of fabricating a semiconductor light-emitting device according to one aspect of the present disclosure includes: (a) forming a semiconductor layer including a light-emitting layer on the first surface of a substrate; (b) forming a first trench and a second trench in the semiconductor layer, the first trench extending in a first direction that is parallel to a principal plane of the substrate, and the second trench being disposed inside and parallel to the first trench; (c) forming a third trench parallel to the first trench in the second surface of the substrate opposite to the first surface of the substrate; and (d) forming a semiconductor light-emitting device by dividing the substrate. In (b), the second trench reaches the substrate, and a portion of the substrate removed by forming the second trench has a depth less than or equal to 5 µm. In (d), an end of at least one divided side of the semiconductor light-emitting device is in the second trench. The first trench has a first width, and the second trench has a second width. The second width is less than the first width.

The present disclosure provides the method of fabricating a semiconductor light-emitting device, in which it is possible to divide the substrate at a desired position and the semiconductor light-emitting device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

Figure 1:
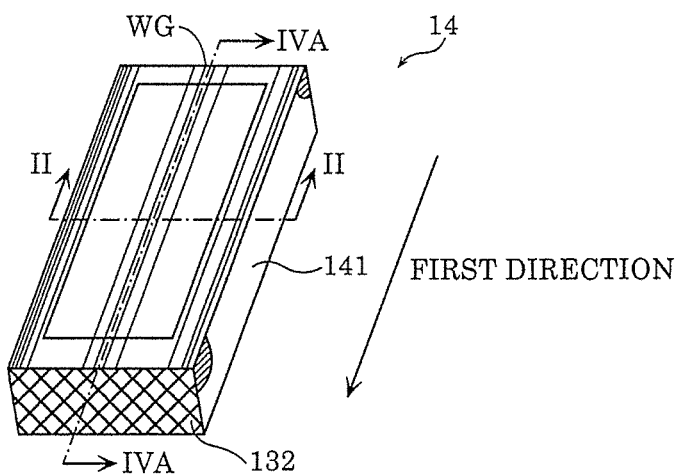
FIG. 1 is a schematic perspective view of a semiconductor laser device according to an embodiment.

Hereinafter, an embodiment of the present disclosure is described with reference to the Drawings. It should be noted that the embodiment described below represents a specific example of the present disclosure. Thus, the numerical values, the shapes, the materials, the structural elements, the positions of the structural elements, the connections between the structural elements, the steps, the order of the steps, and others described in the embodiment are mere examples and are not intended to limit the present disclosure. Thus, among the structural elements described in the embodiment, the structural elements not recited in the independent claims, which represent the superordinate concepts of the present disclosure, are described as optional structural elements.

The Drawings are schematic views and not necessarily precise. Thus, reduction scales used in the Drawings are not necessarily the same. In the Drawings, identical reference symbols are assigned to substantially the same elements, and overlapping explanations are omitted or simplified.

Embodiment

A method of fabricating a semiconductor light-emitting device according to an embodiment and the semiconductor light-emitting device fabricated by the method are described.

[1. Semiconductor Light-Emitting Device]

A semiconductor light-emitting device according to the embodiment is described. Hereinafter, a configuration of semiconductor laser device 14 fabricated by a fabrication method, which is described later, is described with reference to the Drawings. Semiconductor laser device 14 is an example of a semiconductor light-emitting device.

Figure 2:
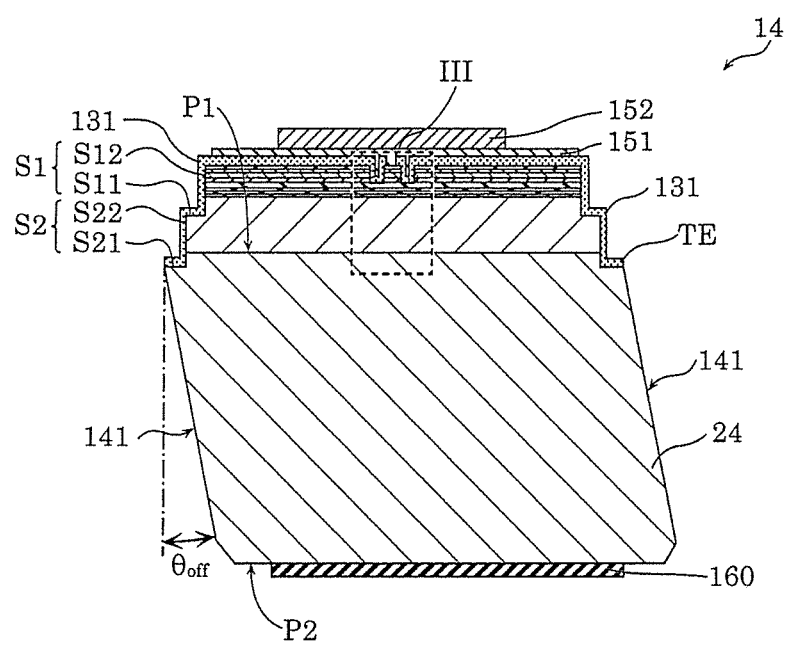
FIG. 2 is a first cross-sectional view of the semiconductor laser device according to the embodiment and schematically illustrates a configuration of the semiconductor laser device.
Figure 3:
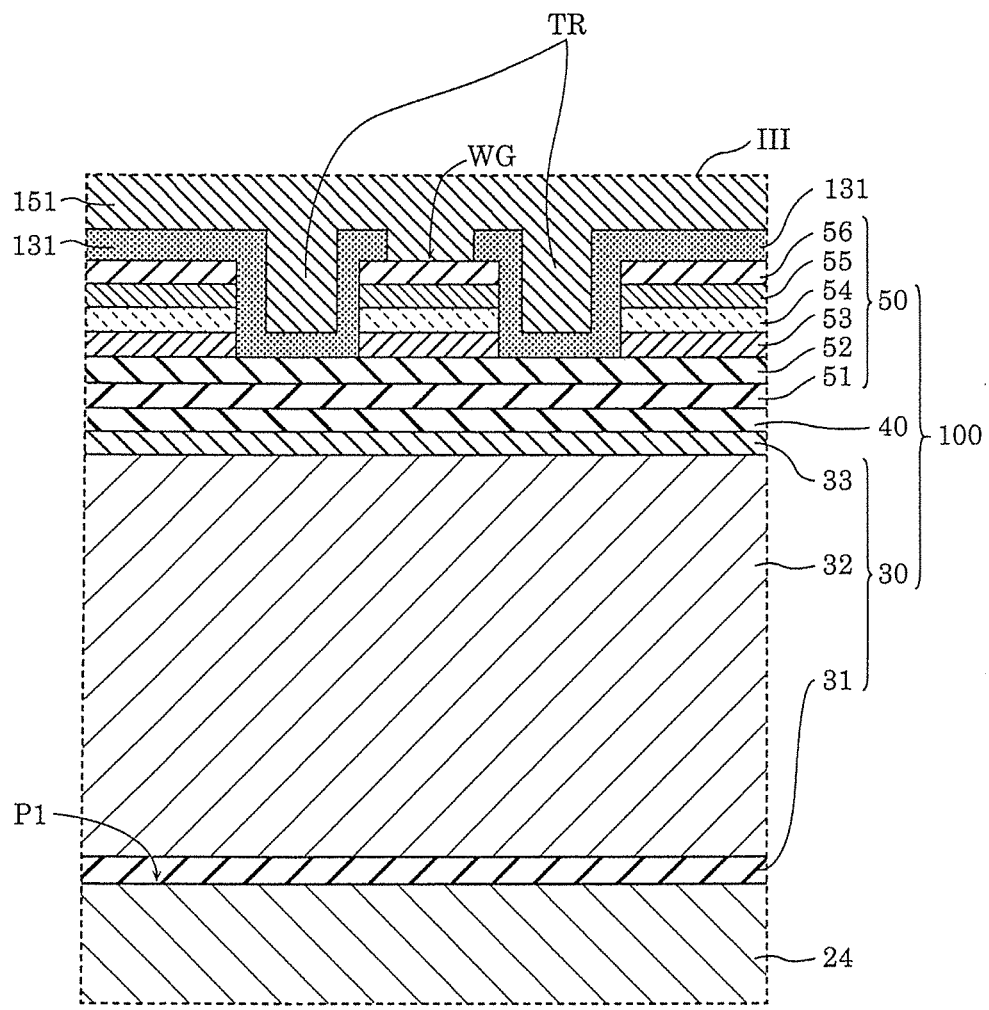
FIG. 3 is a partially enlarged view of FIG. 2 and a cross-sectional view of the semiconductor layers of the semiconductor laser device according to the embodiment.
Figure 4A:
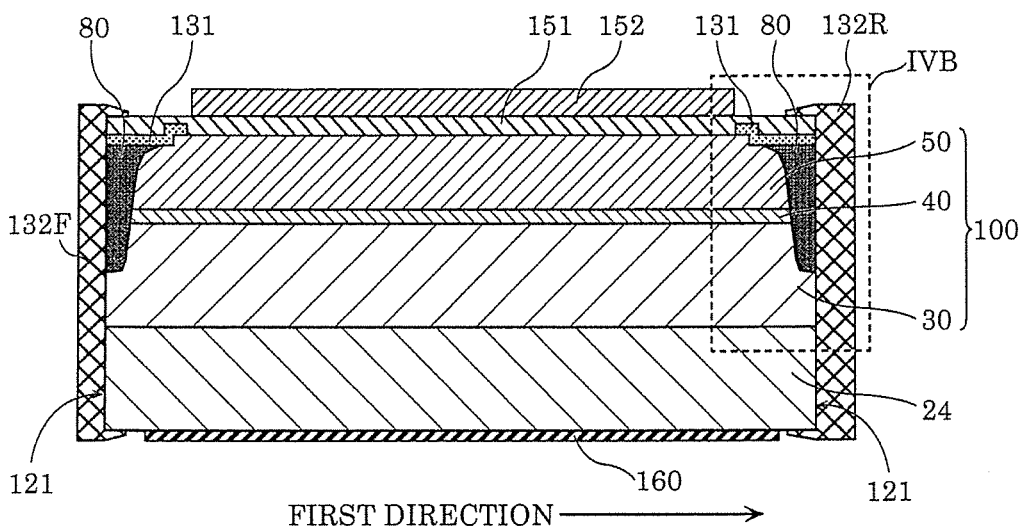
FIG. 4A is a second cross-sectional view of the semiconductor laser device according to the embodiment and schematically illustrates the configuration of the semiconductor laser device.
Figure 4B:
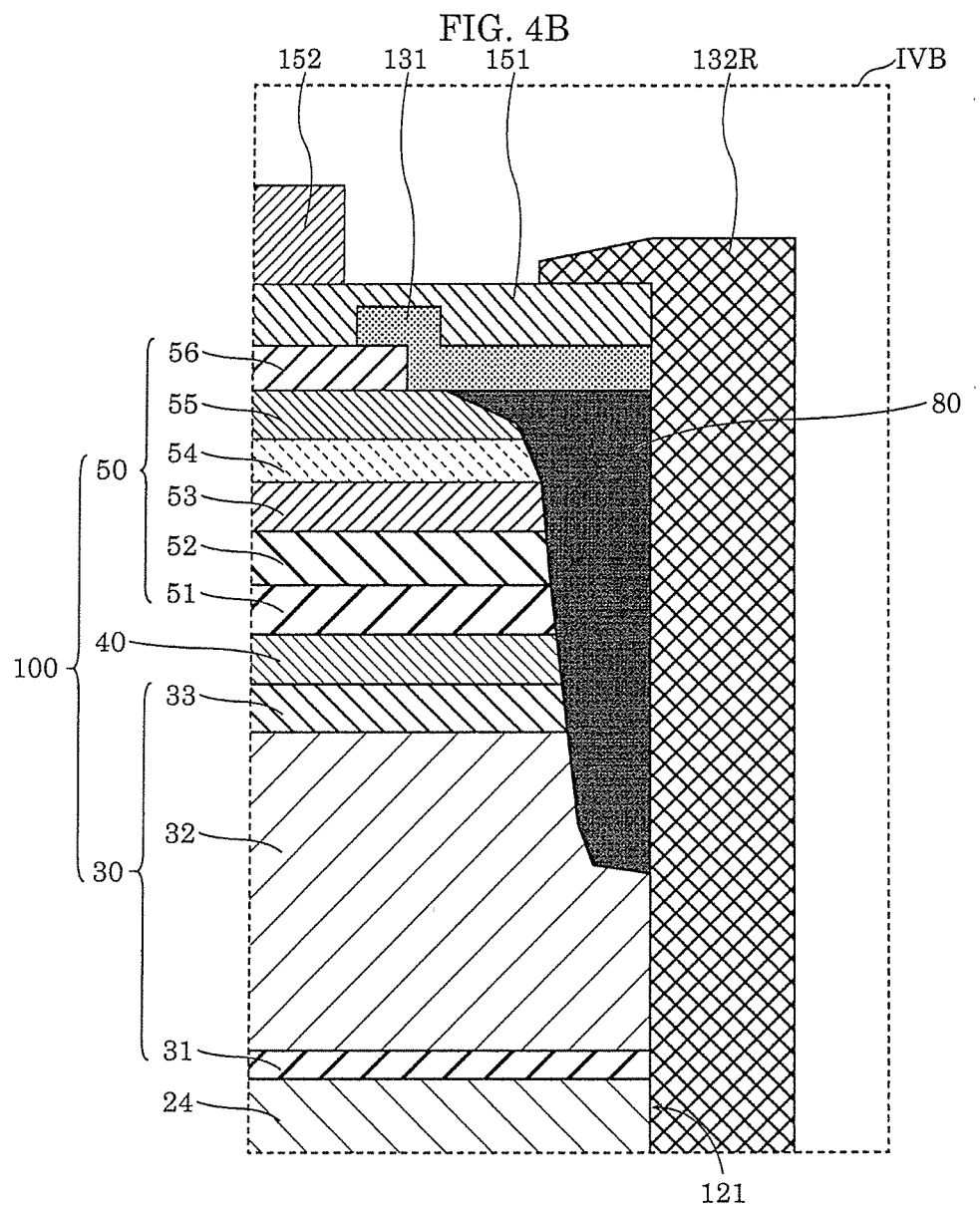
FIG. 4B is a partially enlarged view of FIG. 4A.

FIG. 1 is a schematic perspective view of semiconductor laser device 14 according to the embodiment. FIG. 2 is a first cross-sectional view of semiconductor laser device 14 according to the embodiment and schematically illustrates the configuration of semiconductor laser device 14. FIG. 2 is a cross-sectional view of semiconductor laser device 14 taken along arrows II-II illustrated in FIG. 1. FIG. 3 is a partially enlarged view of FIG. 2 and a cross-sectional view of the semiconductor layers of semiconductor laser device 14 according to the embodiment. FIG. 3 is an enlarged view of the portion inside dashed frame III illustrated in FIG. 2. FIG. 4A is a second cross-sectional view of semiconductor laser device 14 according to the embodiment and schematically illustrates the configuration of semiconductor laser device 14. FIG. 4A is a cross-sectional view of semiconductor laser device 14 taken along arrows IVA-IVA illustrated in FIG. 1. FIG. 4B is a partially enlarged view of FIG. 4A and an enlarged view of the portion inside dashed frame IVB illustrated in FIG. 4A.

As illustrated in FIG. 3, semiconductor laser device 14 includes chip-like substrate 24 and semiconductor layer 100. Semiconductor layer 100 is disposed on first surface P1 of chip-like substrate 24 and includes light-emitting layer 40. Chip-like substrate 24 is an n-GaAs substrate and a 10-degree-off substrate having a plane orientation inclined at an angle of 10 degrees relative to the plane orientation of (100) toward the plane orientation of (011). The plane orientation of first surface P1 corresponds to the plane orientation inclined at an angle of 10 degrees relative to the plane orientation of (100) toward the plane orientation of (011). Semiconductor layer 100 includes first semiconductor layer 30, light-emitting layer 40, and second semiconductor layer 50 that are stacked sequentially from the side on which chip-like substrate 24 is present. First semiconductor layer 30 includes a first conductivity type layer, and second semiconductor layer 50 includes a second conductivity type layer.

As illustrated in FIG. 2, semiconductor laser device 14 includes p-side bottom electrode 151, p-side top electrode 152, and n-side electrode 160. P-side bottom electrode 151 and p-side top electrode 152 are disposed above semiconductor layer 100. N-side electrode 160 is disposed on second surface P2 of chip-like substrate 24.

Semiconductor layer 100 of semiconductor laser device 14 has waveguide WG having a ridge structure. As illustrated in FIG. 1, waveguide WG extends in the first direction.

As illustrated in FIG. 4A, the end faces of semiconductor laser device 14 in the first direction correspond to cleaved end faces 121. Two cleaved end faces 121 function as the resonator surfaces of semiconductor laser device 14. Second protective film 132F and second protective film 132R that function as reflectance control films are formed on cleaved end faces 121. Second protective film 132F functions as the reflectance control film on the front side of a resonator, and second protective film 132R functions as the reflectance control film on the rear side of the resonator.

As illustrated in FIGS. 4A and 4B, window regions 80 for suppressing light-emitting layer 40 from absorbing light are formed near respective cleaved end faces 121, which function as resonator surfaces.

As illustrated in FIG. 2, semiconductor laser device 14 has first steps S1 and second steps S2 in portions including the sides of semiconductor layer 100. First step S1 includes first side S12 and first bottom S11. First side S12 includes the side of light-emitting layer 40. First bottom S11 is connected to the end portion of first side S12 near chip-like substrate 24 and extends in the direction that intersects first side S12. Second step S2 includes second side S22 and second bottom S21. Second side S22 is connected to the end portion of first bottom S11 far from first side S12 and extends in the direction from semiconductor layer 100 toward chip-kike substrate 24. Second bottom 21 is connected to the end portion of second side S22 far from first bottom S11 and extends in the direction that intersects second side S22. First protective film 131 is disposed on first side S12. Thus, first protective film 131 protects the sides of light-emitting layer 40. Accordingly, it is possible to suppress degradation of light-emitting layer 40 and adhesion of, for example, foreign matter to the sides of light-emitting layer 40.

As illustrated in FIG. 2, divided sides 141 of semiconductor laser device 14 are crystal planes (011) of chip-like substrate 24. Divided sides 141 are formed by dividing bar-like substrate 22 by, for example, the fabrication method described later. The crystal planes of chip-like substrate 24 have off-angle θoff relative to the normal line to second surface P2 in the second direction perpendicular to the first direction, the second direction being parallel to a principal plane of the substrate. The plane orientation of second surface P2 corresponds to the plane orientation inclined at an angle of 10 degrees relative to the plane orientation of (−100), that is, 10 degrees off from the plane orientation of (−100), toward the plane orientation of (0-1-1). Thus, divided sides 141 made of the crystal planes are inclined at an angle of θoff degrees (=10 degrees) relative to the normal line to second surface P2.

Hereinafter, the structural elements of semiconductor laser device 14 are described.

Chip-like substrate 24 is formed by dividing bar-like substrate 22 into chips. The configuration of chip-like substrate 24 is not limited to a particular configuration.

First semiconductor layer 30 includes the first conductivity type layer. The configuration of first semiconductor layer 30 is not limited to a particular configuration. In the embodiment, as illustrated in FIG. 3, first semiconductor layer 30 includes n-type buffer layer 31, n-type clad layer 32, and n-side light guide layer 33. N-type buffer layer 31 is an n-GaAs layer having a film thickness of 0.4 μm. N-type clad layer 32 is an n-$(Al_{0.16}Ga_{0.84})_{0.5}In_{0.5}P$ layer having a film thickness of 4.7 μm. N-side light guide layer 33 is a GaInP layer having a film thickness of 0.09 μm.

Light-emitting layer 40 serves as the light-emitting portion of semiconductor laser device 14. The configuration of light-emitting layer 40 is not limited to a particular configuration. In the embodiment, light-emitting layer 40 is a multi-quantum-well active layer including an $Al_{0.59}Ga_{0.41}As$ barrier layer having a film thickness of 0.03 μm, a GaAs well layer having a film thickness of 0.0065 μm, an $Al_{0.59}Ga_{0.41}As$ barrier layer having a film thickness of 0.004 μm, a GaAs well layer having a film thickness of 0.0065 μm, and an $Al_{0.59}Ga_{0.41}As$ barrier layer having a film thickness of 0.021 μm that are stacked sequentially from the side on which n-side light guide layer 33 is present. It should be noted that the well layers may be InGaAs layers or GaAsP layers.

Second semiconductor layer 50 includes the second conductivity type layer whose conductivity type differs from that of the first conductivity type layer. The configuration of second semiconductor layer 50 is not limited to a particular configuration. In the embodiment, as illustrated in FIG. 3, second semiconductor layer 50 includes p-side light guide layer 51, p-type first clad layer 52, p-type second clad layer 53, p-type third clad layer 54, p-type interlayer 55, and p-type contact layer 56. P-side light guide layer 51 is a GaInP layer having a film thickness of 0.07 μm. P-type first clad layer 52 is a p-$(Al_{0.30}Ga_{0.70})_{0.5}In_{0.5}P$ layer having a film thickness of 0.17 μm. P-type second clad layer 53 is a p-$(Al_{0.50}Ga_{0.40})_{0.5}In_{0.5}P$ layer having a film thickness of 0.4 μm. P-type third clad layer 54 is a p-$(Al_{0.30}Ga_{0.70})_{0.5}In_{0.5}P$ layer having a film thickness of 0.6 μm. P-type interlayer 55 is a p-AlGaInP layer having a film thickness of 0.106 μm. P-type interlayer 55 has a lower aluminum composition than p-type third clad layer 54. P-type contact layer 56 is a p-GaAs layer having a film thickness of 0.23 μm.

As illustrated in FIG. 3, first protective film 131 is formed on the sides and a portion of the top of the ridge, which serves as waveguide WG, trenches TR, flat portions on both sides of a pair of trenches TR, first steps S1, and second steps S2. First protective film 131 has an opening above the ridge so that the ridge is exposed. As illustrated in FIG. 4B, first protective film 131 covers a portion that is near cleaved end face 121 and that includes window region 80. As long as first protective film 131 is a dielectric film, the material of first protective film 131 is not limited to a particular film material. First protective film 131 may be made of, for example, $SiO_2$, SiN, $TiO_2$, $ZrO_2$, $Al_2O_3$, $Nb_2O_5$, or $Ta_2O_5$. In the embodiment, first protective film 131 is an SiN film having a film thickness of around 180 nm.

P-side bottom electrode 151 is a patterned metal film. In the embodiment, p-side bottom electrode 151 includes a Ti film having a film thickness of around 50 nm, a Pt film having a film thickness of around 150 nm, and an Au film having a film thickness of around 50 nm that are stacked sequentially from the side on which semiconductor layer 100 is present. P-side bottom electrode 151 is connected to p-type contact layer 56 in the opening of first protective film 131.

In the embodiment, p-side top electrode 152 is an Au film having a film thickness of 2.0 μm to 5.0 μm. The thickness of the Au film may range from 2.0 μm to 3.0 μm.

In the embodiment, n-side electrode 160 includes an AuGe film having a film thickness of 90 nm, an Ni film having a film thickness of 20 nm, an Au film having a film thickness of 50 nm, a Ti film having a film thickness of 100 nm, a Pt film having a film thickness of 50 nm, a Ti film having a film thickness of 50 nm, a Pt film having a film thickness of 100 nm, and an Au film having a film thickness of 500 nm that are stacked sequentially from the side on which chip-like substrate 24 is present.

The configuration of second protective film 132F and the configuration of second protective film 132R are not limited to particular configurations. The method of forming second protective film 132F and the method of forming second protective film 132R are not limited to particular methods. In the embodiment, second protective film 132F used on the front side of semiconductor laser device 14 is a dielectric multilayer film in which a combination of an $Al_2O_3$ film having a film thickness of 50 nm and a $Ta_2O_5$ film having a film thickness of 55 nm is stacked once or more than once, the $Al_2O_3$ film and the $Ta_2O_5$ film being stacked sequentially from the side on which cleaved end face 121 is present. Moreover, second protective film 132R used on the rear side of semiconductor laser device 14 is a dielectric multilayer film that is formed by sequentially stacking an $Al_2O_3$ film having a film thickness of λ/8 $n_A$, an SiO$_2$ film having a film thickness of λ/8 $n_S$, and a Ta$_2$O$_5$ film having a film thickness of x/4$n_T$ from the side on which cleaved end face 121 is present, and then stacking a combination of a SiO$_2$ film having a film thickness of λ/4 $n_S$ and a Ta$_2$O$_5$ film having a film thickness of λ/4$n_T$ more than once. It should be noted that λ denotes the oscillation wavelength of semiconductor laser device 14, and $n_A$, $n_T$, and $n_S$ respectively denote the refractive indexes of the Al$_2$O$_3$ film, the Ta$_2$O$_5$ film, and the SiO$_2$ film for light having wavelength λ. In the embodiment, λ is set to around 860 nm. An Al$_2$O$_3$ film having a film thickness of 65 nm, an SiO$_2$ film having a film thickness of 74 nm, and a Ta$_2$O$_5$ film having a film thickness of 102 nm are stacked sequentially from the side on which cleaved end face 121 is present, and then a combination of a SiO$_2$ film having a film thickness of 147 nm and a Ta$_2$O$_5$ film having a film thickness of 102 nm is stacked more than once.

Window regions 80 are formed by diffusing impurities such as Zn near the resonator surfaces of semiconductor laser device 14 to increase the band gap of light-emitting layer 40. An impurity concentration in the portions of light-emitting layer 40 in which window regions 80 are formed is, for example, less than or equal to 5×10$^{19}$/cm$^3$ and may be less than or equal to 1×10$^{19}$/cm$^3$. An average impurity concentration in the portions of p-type first clad layer 52, p-type second clad layer 53, and p-type third clad layer 54 in which window regions 80 are formed is, for example, less than or equal to six times and may be less than or equal to three times that of the remaining portions of p-type first clad layer 52, p-type second clad layer 53, and p-type third clad layer 54 in which window regions 80 are not formed. Alternatively, an average impurity concentration in the portions of p-type first clad layer 52, p-type second clad layer 53, and p-type third clad layer 54 in which window regions 80 are formed may be less than or equal to six times or three times that in light-emitting layer 40.

[2. Method of Fabricating Semiconductor Light-Emitting Device]

Next, the method of fabricating the semiconductor light-emitting device according to the embodiment is described. In the embodiment, the steps of the method of fabricating the semiconductor laser device, which is described above as an example of the semiconductor light-emitting device, are described.

[2-1. Step of Forming Semiconductor Layer]

Figure 5:
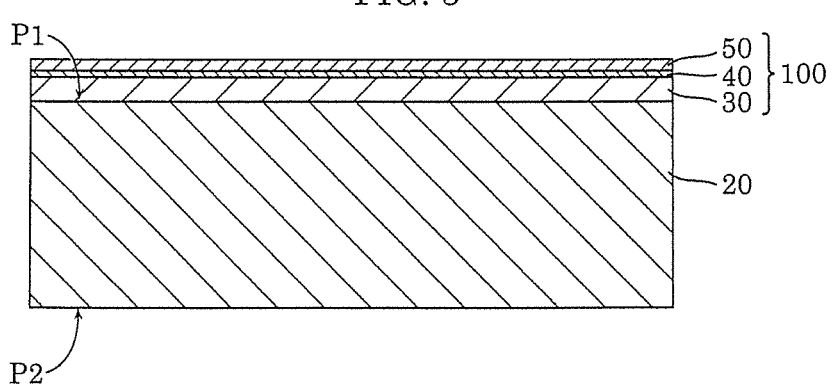
FIG. 5 is a schematic cross-sectional view of a substrate and illustrates the outline of the step of forming the semiconductor layers of the semiconductor laser device according to the embodiment.

The step of forming the semiconductor layers according to the embodiment is described with reference to the Drawings. FIG. 5 is a schematic cross-sectional view of substrate 20 and illustrates the outline of the step of forming the semiconductor layers of the semiconductor laser device according to the embodiment.

As illustrated in FIG. 5, substrate 20 having first surface P1 and second surface P2 is prepared, and semiconductor layer 100 including light-emitting layer 40 is formed on first surface P1 of substrate 20. The layers of semiconductor layer 100 are stacked by, for example, metal-organic chemical vapor deposition (MOCVD). In the embodiment, semiconductor layer 100 is formed by sequentially forming first semiconductor layer 30, which includes the first conductivity type layer, light-emitting layer 40, and second semiconductor layer 50, which includes the second conductivity type layer, from the side on which substrate 20 is present.

The material of substrate 20 is not limited to a particular substrate material. In the embodiment, an n-GaAs substrate is used as substrate 20.

First semiconductor layer 30 includes the first conductivity type layer. The configuration of first semiconductor layer 30 is not limited to a particular configuration. In the embodiment, first semiconductor layer 30 includes the n-type buffer layer, the n-type clad layer, and the n-side light guide layer.

Light-emitting layer 40 serves as the light-emitting portion of the semiconductor laser device. The configuration of light-emitting layer 40 is not limited to a particular configuration. In the embodiment, light-emitting layer 40 is a multi-quantum-well active layer including an AlGaAs barrier layer and a GaAs well layer.

Second semiconductor layer 50 includes the second conductivity type layer whose conductivity type differs from that of the first conductivity type layer. The configuration of second semiconductor layer 50 is not limited to a particular configuration. In the embodiment, second semiconductor layer 50 includes the p-side light guide layer, the p-type first clad layer, the p-type second clad layer, the p-type third clad layer, the p-type interlayer, and the p-type contact layer that are stacked sequentially from the side on which substrate 20 is present.

Then, in the embodiment, the window regions are formed in portions near the resonator surfaces of the semiconductor laser device. For instance, a ZnO film to be a diffusion source and an SiN film or an SiO film for suppressing Zn from evaporating are formed sequentially above the p-type contact layer. Then, by diffusing Zn near the resonator surfaces of the semiconductor laser device through a heat treatment, the bad gap of light-emitting layer 40 is increased. Thus, it is possible to form the window regions for suppressing light-emitting layer 40 from absorbing light. It should be noted that a p-type GaInP layer and a p-type AlGaInP layer may be formed directly above the p-type contact layer. By forming such window regions, it is possible to suppress degradation of the portions near the resonator surfaces of the semiconductor laser device.

[2-2. Step of Forming Waveguide]

Figure 6:
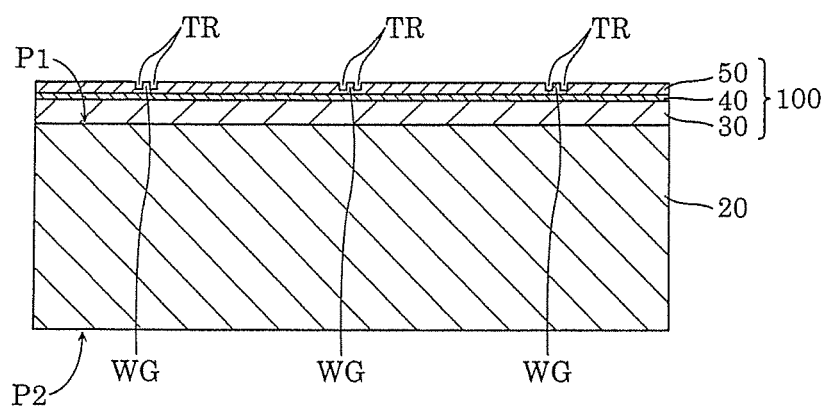
FIG. 6 is a schematic cross-sectional view of the substrate and illustrates the outline of the step of forming waveguides according to the embodiment.

The step of forming the waveguides is described with reference to the Drawings. FIG. 6 is a schematic cross-sectional view of substrate 20 and illustrates the outline of the step of forming the waveguides according to the embodiment.

As illustrated in FIG. 6, by forming pairs of trenches TR in the direction perpendicular to the paper on which FIG. 6 is drawn, in second semiconductor layer 50 formed above substrate 20, waveguides WG each having a ridge between a pair of trenches TR are formed. Thus, semiconductor layer 100 has waveguides WG extending in the first direction.

The method of forming waveguides WG is not limited to a particular method. In the embodiment, to form the ridges, a mask made of, for example, SiO$_2$, is formed by photolithography. Then, trenches TR are formed, that is, the ridges are formed by non-selective etching such as dry etching. It should be noted that dry etching is performed on the p-type contact layer, the p-type interlayer, the p-type third clad layer, and the p-type second clad layer. However, the p-type second clad layer is not completely removed, and a part of the p-type second clad layer is left.

A protective film made of, for example, SiO$_2$ is formed on the entirety of the top of semiconductor layer 100 having the ridges.

By dry etching, the SiO$_2$ protective film is removed only from the bottoms of trenches TR. The protective film covers the side walls and top portions of the ridges.

Then, the p-type second clad layer is completely removed by selective etching such as wet etching. Thus, the p-type first clad layer is exposed at the bottoms of trenches TR. In this manner, it is possible to form waveguides WG in semiconductor layer 100.

[2-3. Step of Forming First Trench]

The step of forming the first trenches is described. In this step, the first trenches extending in the first direction that is parallel to a principal plane of the substrate are formed in semiconductor layer 100. The first direction corresponds to the direction in which waveguides WG described above extend. Hereinafter, the step of forming the first trenches is described with reference to the Drawings.

Figure 7:
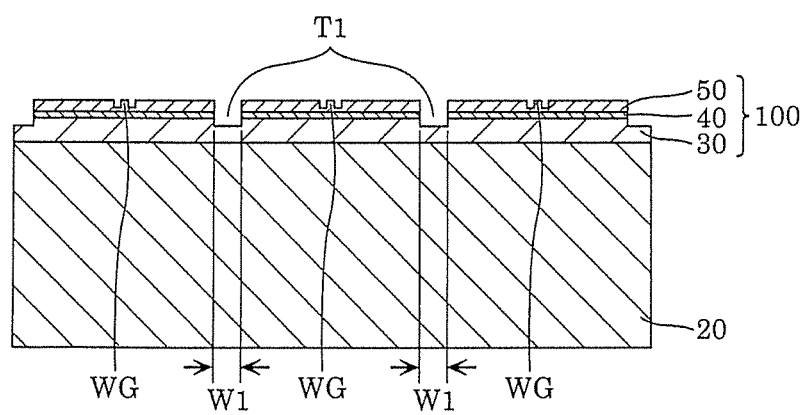
FIG. 7 is a schematic cross-sectional view of the substrate and illustrates the outline of the step of forming first trenches according to the embodiment.

FIG. 7 is a schematic cross-sectional view of substrate 20 and illustrates the outline of the step of forming first trenches T1 according to the embodiment. As illustrated in FIG. 7, semiconductor layer 100 has waveguides WG extending in the first direction. In the step of forming first trenches T1, first trench T1 is formed between waveguides WG next to each other. First trench T1 is formed between waveguides WG next to each other, along waveguides WG. That is, first trenches T1 are formed in the direction perpendicular to the paper on which FIG. 7 is drawn. First trenches T1 reach first semiconductor layer 30. That is, light-emitting layer 40 is exposed at the sides of first trenches T1. First trenches T1 have first width W1.

In the embodiment, first trenches T1 are formed so as to extend from the p-type contact layer to the n-type clad layer. The method of forming first trenches T1 is not limited to a particular method. In the embodiment, a mask made of, for example, $SiO_2$, is formed by photolithography. The portions other than the portions in which first trenches T1 are to be formed are covered by the mask. Then, first trenches T1 are formed by non-selective etching such as dry etching. First trenches T1 have first width W1 of around 10 µm and a depth of around 5 µm. It should be noted that first width W1 is not limited to around 10 µm, but may be greater than 5 µm and less than or equal to 20 µm.

As long as anisotropic plasma etching is employed, any drying etching techniques may be employed in the embodiment. As drying etching, for example, a method using inductively-coupled plasma (hereinafter, referred to as ICP) or electron cyclotron resonance (hereinafter, referred to as ECR) plasma may be employed.

In addition, as etching gas, a mixed gas of $SiCl_4$ and Ar is used. However, $SiCl_4$ may be replaced by, for example, chlorine gas or boron trichloride gas.

In the embodiment, the ICP method is employed as a dry etching method, and a mixed gas of $SiCl_4$ and Ar is used as an etching gas. As etching conditions, the volume content of $SiCl_4$ in the mixed gas may range from 5% to 12%, the temperature of the bottom electrode on which the semiconductor substrate is placed may range from 150 degrees Celsius to 200 degrees Celsius, the internal pressure of a chamber may range from 0.1 Pa to 1 Pa, the bias power of the bottom electrode may range from 50 W to 150 W, and ICP power may range from 200 W to 300 W. However, etching conditions are not limited to the above etching conditions, but may be suitably determined.

[2-4. Step of Forming Second Trench]

The step of forming the second trenches is described. In this step, in semiconductor layer 100, a second trench is formed inside and parallel to first trench T1. The second trenches and the third trenches, which are described later, are formed to divide substrate 20. Hereinafter, the step of forming the second trenches is described with reference to the Drawings.

Figure 8:
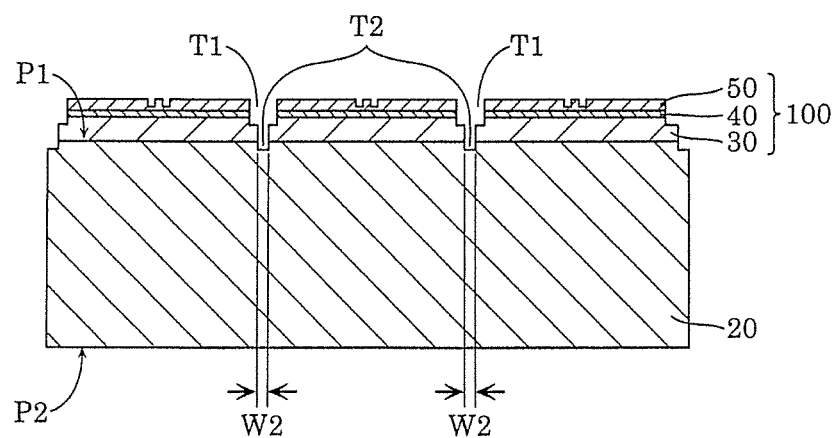
FIG. 8 is a schematic cross-sectional view of the substrate and illustrates the outline of the step of forming second trenches according to the embodiment.

FIG. 8 is a schematic cross-sectional view of substrate 20 and illustrates the outline of the step of forming second trenches T2 according to the embodiment. As illustrated in FIG. 8, second trench T2 is formed inside and parallel to first trench T1. First trench T1 has a bottom, and second trench T2 extends from the bottom of first trench T1. In the embodiment, second trench T2 extends from the bottom of first trench T1 to substrate 20.

A portion of substrate 20 removed by forming second trench T2 has a depth greater than 0 µm and less than or equal to 5 µm. The deeper the portion, it is possible to decrease the length of a portion of the substrate to be divided in the step of dividing the substrate, which facilitates the division of the substrate. The step of dividing the substrate is described later. Meanwhile, the deeper second trench T2, the greater the projection and depression of substrate 20, which may make a photo process difficult. Moreover, for example, in the step of grinding substrate 20, a possibility of substrate 20 breaking increases. In consideration of these problems, a portion of substrate 20 removed by forming second trench T2 may have a depth less than or equal to around 5 µm. In the embodiment, we succeeded to form second trenches T2 having an average depth of 1.977 µm.

Second trenches T2 have second width W2. Second width W2 is less than first width W1 of first trenches T1.

The method of forming second trenches T2 is not limited to a particular method. In the embodiment, to form second trench T2 extending from the bottom of first trench T1 to substrate 20, a mask made of, for example, $SiO_2$ is formed by photolithography, the mask covering the portions other than the portions in which second trenches T2 are to be formed. Then, second trenches T2 are formed by non-selective etching such as dry etching. Second trenches T2 have second width W2 of around 7 µm and a depth of around 3 µm. It should be noted that second width W2 is not limited to around 7 µm, but may be greater than 0 µm and less than or equal to 10 µm.

Figure 9:
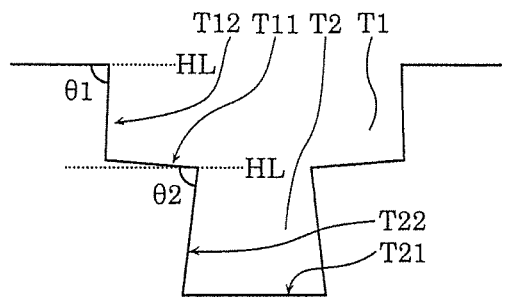
FIG. 9 schematically illustrates a shape of each of a first trench and a second trench according to the embodiment.

A shape of first trench T1 and a shape of second trench T2 are described below in detail with reference to the Drawings. FIG. 9 schematically illustrates a shape of each of first trench T1 and second trench T2 according to the embodiment. FIG. 9 also illustrates direction HL parallel to second surface P2 of substrate 20.

As illustrated in FIG. 9, first trench T1 has bottom T11 and sides T12, and second trench T2 has bottom T21 and sides T22.

Second trench T2 is formed near the center in the width direction of first trench T1. That is, second trench T2 is formed so that bottom T11 of first trench T1 is present on both sides of second trench T2.

We formed first trench T1 and second trench T2 and found that side T12 of first trench T1 was inclined at an average angle of 88.37 degrees relative to second surface P2. We also found that side T22 of second trench T2 was inclined at an average angle of 88.55 degrees relative to second surface P2. To obtain effects of the method of fabricating the semiconductor light-emitting device according to the embodiment, side T12 of first trench T1 and side T22 of second trench T2 may be inclined at an average angle of 85 degrees to 95 degrees relative to second surface P2. That is, angle θ1 and angle θ2 illustrated in FIG. 9 may range from 85 degrees to 95 degrees, angle θ1 being formed by side T12 of first trench T1 and second surface P2 and angle θ2 being formed by side T22 of second trench T2 and second surface P2.

[2-5. Step of Forming First Protective Film]

The step of forming the first protective film is described. The first protective film is formed on the sides of light-emitting layer 40 in first trenches T1 and suppresses light-emitting layer 40 from being exposed. Thus, it is possible to suppress degradation of light-emitting layer 40. In addition, it is possible to suppress occurrence of current leakage due to adhesion of foreign matter to the sides of light-emitting layer 40. Hereinafter, the step of forming the first protective film is described with reference to the Drawings.

Figure 10A:
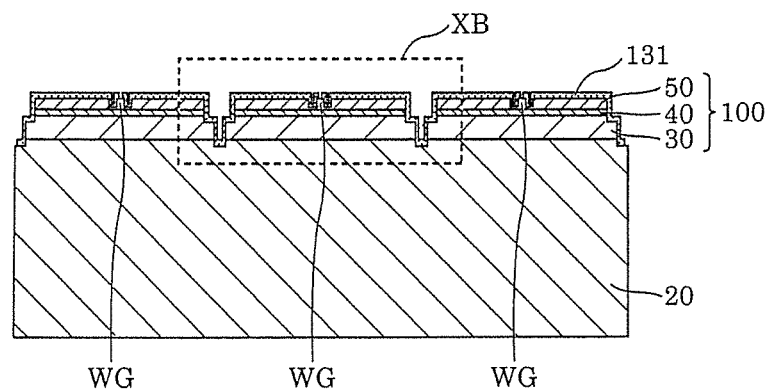
FIG. 10A is a schematic cross-sectional view of the substrate and illustrates the outline of the step of forming a first protective film according to the embodiment.
Figure 10B:
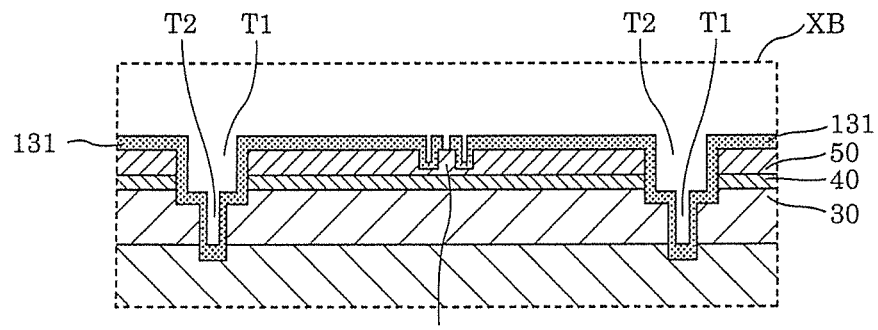
FIG. 10B is a partially enlarged view of FIG. 10A and a schematic cross-sectional view of the substrate and illustrates the outline of the step of forming the first protective film according to the embodiment.

FIG. 10A is a schematic cross-sectional view of substrate 20 and illustrates the outline of the step of forming first protective film 131 according to the embodiment. FIG. 10B is a partially enlarged view of FIG. 10A and a schematic cross-sectional view of substrate 20 and illustrates the outline of the step of forming first protective film 131 according to the embodiment. FIG. 10B is an enlarged view of the portion inside dashed frame XB illustrated in FIG. 10A. As illustrated in FIGS. 10A and 10B, first protective film 131 is formed on the sides of light-emitting layer 40 in first trenches T1. First protective film 131 may be formed on portions other than the sides of light-emitting layer 40 in first trenches T1. In the embodiment, first protective film 131 covers at least the sides of first trenches T1. As illustrated in FIGS. 10A and 10B, first protective film 131 is formed on first trenches T1, second trenches T2, and the portions of semiconductor layer 100 other than a portion of the top portion of each ridge. A portion of the top portion of each ridge on which first protective film 131 is not formed is to be connected to p-side bottom electrode 151 to be formed later.

The method of forming first protective film 131 is not limited to a particular method. In the embodiment, first protective film 131 made of SiN and having a film thickness of around 180 nm is formed on the sides and a portion of the top portion of each ridge, trenches TR, flat portions on both sides of each pair of trenches TR, the sides and bottoms of first trenches T1, and the sides and bottoms of second trenches T2. It should be noted that the film thickness of first protective film 131 is not limited to around 180 nm, but may be greater than 120 nm and less than or equal to 250 nm.

Figure 11:
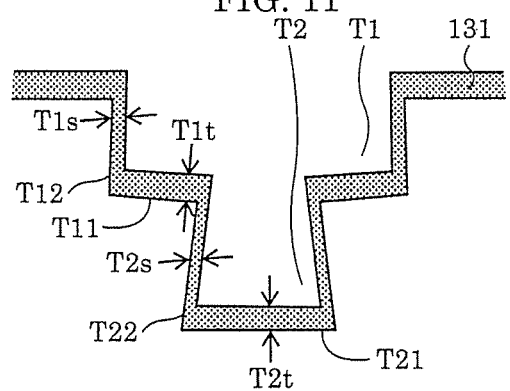
FIG. 11 schematically illustrates the dimensions of the first protective film on the first trench and the second trench according to the embodiment.

First protective film 131 on first trench T1 and first protective film 131 on second trench T2 are described in detail with reference to the Drawings. FIG. 11 schematically illustrates the dimensions of first protective film 13 on first trench T1 and second trench T2 according to the embodiment.

As illustrated in FIG. 11, in the embodiment, first protective film 131 covers bottom T11 and sides T12 of first trench T1 and bottom T21 and sides T22 of second trench T2. The following relationship (1) is satisfied, where T1$t$ denotes the film thickness of first protective film 131 on bottom T11 of first trench T1, and T2$s$ denotes the film thickness of first protective film 131 on sides T22 of second trench T2.

$$T1t > T2s \quad (1)$$

Moreover, the following relationship (2) is satisfied, where T1$s$ denotes the film thickness of first protective film 131 on sides T12 of first trench T1, and T2$t$ denotes the film thickness of first protective film 131 on bottom T21 of second trench T2.

$$T1t \geq T2t > T1s \geq T2s \quad (2)$$

When the above relationships are satisfied, for example, during the division of substrate 20, it is possible to suppress first protective film 131 on the sides of light-emitting layer 40 from peeling. The effects of the relationships are described later.

[2-6. Step of Forming Electrode]

The step of forming electrodes is described. Electrodes formed in this step are, for example, p-side electrodes and n-side electrodes for supplying power to the semiconductor laser device fabricated by the fabrication method according to the embodiment. Hereinafter, the step of forming electrodes is described with reference to the Drawings.

Figure 12:
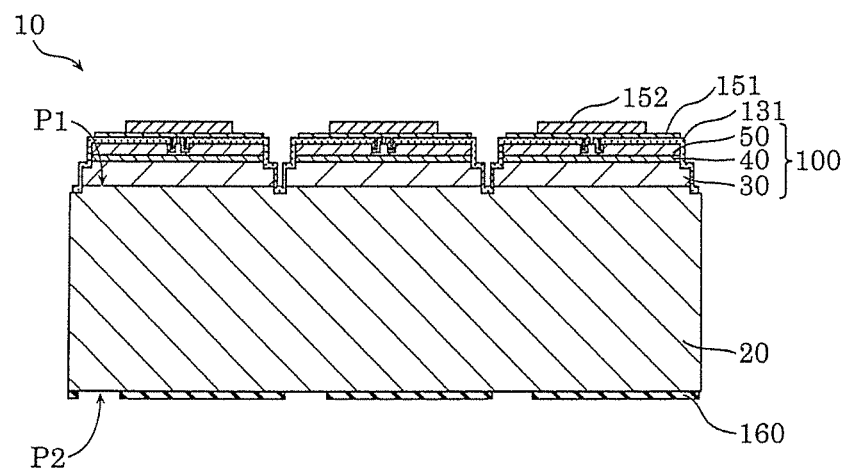
FIG. 12 is a schematic side view of the substrate and illustrates the outline of the step of forming electrodes according to the embodiment.

FIG. 12 is a schematic side view of substrate 20 and illustrates the outline of the step of forming the electrodes according to the embodiment. As illustrated in FIG. 12, p-side bottom electrodes 151 are formed in the portions other than first trenches T1 and second trenches T2 in first surface P1 of substrate 20. That is, p-side bottom electrodes 151 are formed on the top portions of the ridges and top portions of semiconductor layer 100 including trenches TR. Moreover, p-side top electrodes 152 are formed above p-side bottom electrodes 151. P-side bottom electrodes 151 are connected to second semiconductor layer 50 via the openings in first protective film 131 formed on the ridges. N-side electrodes 160 are formed on second surface P2 of substrate 20.

The configuration of each of p-side bottom electrode 151, p-side top electrode 152, and n-side electrode 160 is not limited to a particular configuration. The method of forming p-side bottom electrodes 151, the method of forming p-side top electrodes 152, and the method of forming n-side electrodes 160 are not limited to particular methods. In the embodiment, first trenches T1 and second trenches T2 are masked with a resist by photolithography. After preliminary treatment by wet etching, a Ti film having a film thickness of around 50 nm, a Pt film having a film thickness of around 150 nm, and an Au film having a film thickness of around 50 nm are formed sequentially by vapor deposition.

Next, patterns for p-side top electrodes 152 are formed with a resist mask by photolithography. An Au film having a film thickness of 2.0 μm to 5.0 μm is formed by an electrolytic plating method. Then, patterned p-side top electrodes 152 are formed by removing the resist by a lift-off process. The thickness of the Au film may range from 2.0 μm to 3.0 μm.

Substrate 20 is ground so that the thickness from second surface P2 of substrate 20 to p-side top electrodes 152 is around 100 μm (grinding step is not illustrated). A resist mask is formed on second surface P2 by photolithography. After preliminary treatment by wet etching, an AuGe film having a film thickness of 90 nm, an Ni film having a film thickness of 20 nm, an Au film having a film thickness of 50 nm, a Ti film having a film thickness of 100 nm, a Pt film having a film thickness of 50 nm, a Ti film having a film thickness of 50 nm, a Pt film having a film thickness of 100 nm, and an Au film having a film thickness of 500 nm are formed sequentially by vapor deposition. Then, the resist mask is removed by the lift-off process. In this manner, patterned n-side electrodes 160 are formed.

Through the above steps, semiconductor multilayer substrate 10 is formed.

[2-7. Cleaving Step]

A cleaving step is described with reference to the Drawings. In this step, substrate 20 of semiconductor multilayer substrate 10 formed in the above steps is cleaved along a plane corresponding to the resonator surfaces of semiconductor laser devices 14. Hereinafter, the cleaving step is described with reference to the Drawings.

Figure 13:
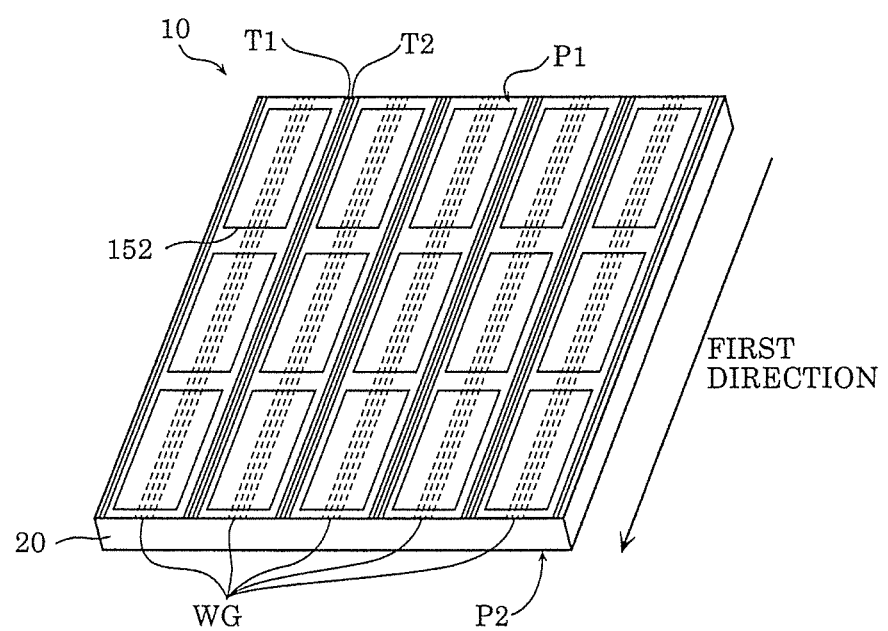
FIG. 13 is a perspective view of a semiconductor multilayer substrate according to the embodiment.
Figure 14:
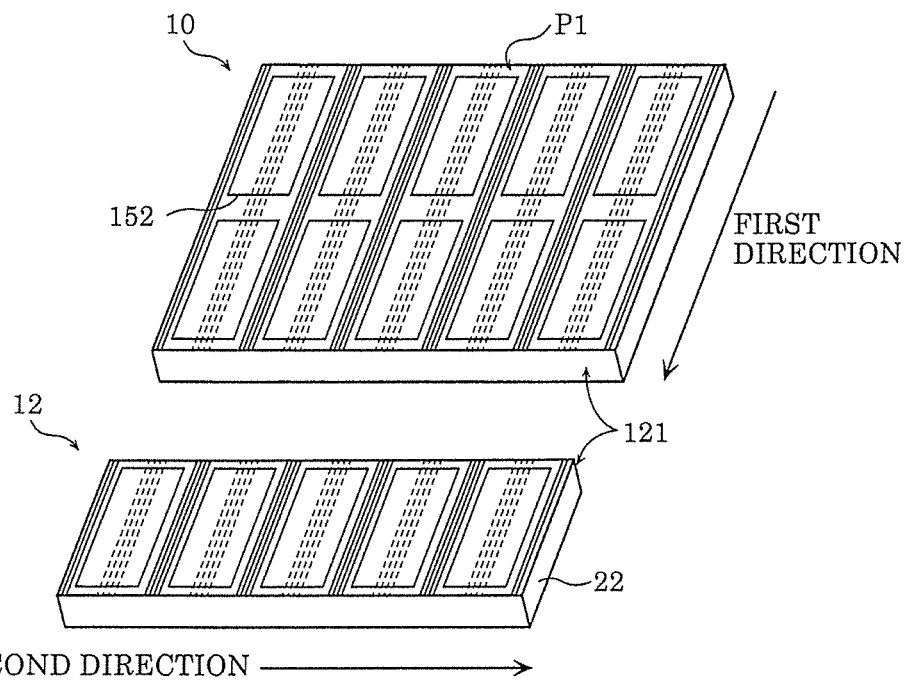
FIG. 14 is a perspective view and illustrates the step of cleaving the semiconductor multilayer substrate according to the embodiment to form a bar-like substrate.

FIG. 13 is a perspective view of semiconductor multilayer substrate 10 according to the embodiment. FIG. 14 is a perspective view and illustrates the step of cleaving substrate 20 of semiconductor multilayer substrate 10 according to the embodiment to form bar-like substrate 22.

P-side top electrodes 152 illustrated in FIG. 13 are disposed for respective semiconductor laser devices in semiconductor multilayer substrate 10. The first direction illustrated in FIG. 13 denotes the direction in which waveguides WG extend, that is, the direction in which the semiconductor laser devices resonate. In this step, as illustrated in FIG. 14, substrate 20 is cleaved along the second direction perpendicular to the first direction, the second direction being parallel to a principal plane of the substrate. In this manner, bar-like substrate 22 having cleaved end face 121 is formed. Thus, it is possible to form bar-like multilayer substrate 12 in which, for example, semiconductor layer 100 is formed on bar-like substrate 22. Through the cleaving step, it is possible to form the resonator surfaces of the semiconductor laser devices.

[2-8. Step of Forming Second Protective Film]

The step of forming the second protective film is described. In this step, the second protective film is formed on cleaved end faces 121 formed in the cleaving step. The second protective film not only functions to protect cleaved end faces 121 but also serves as a reflectance control film on the resonator surfaces. Hereinafter, the step of forming the second protective film is described with reference to the Drawings.

Figure 15:
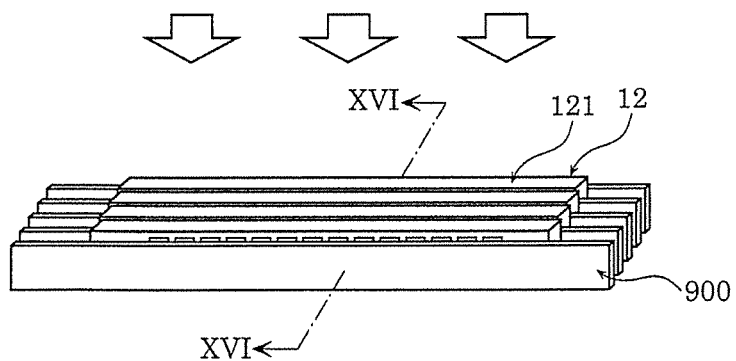
FIG. 15 is a perspective view and illustrates the step of forming a second protective film on bar-like multilayer substrates according to the embodiment.
Figure 16:
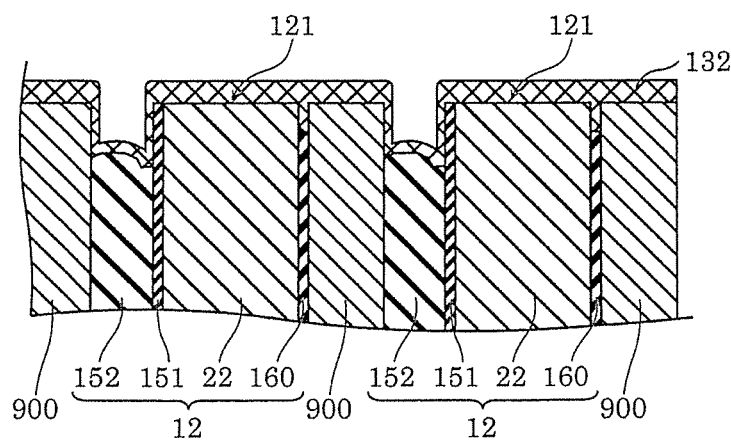
FIG. 16 is a schematic cross-sectional view and illustrates the step of forming the second protective film on the bar-like multilayer substrates according the embodiment.
Figure 17:
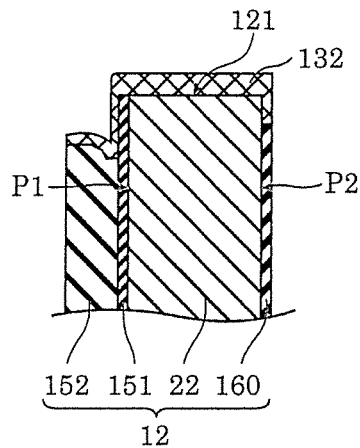
FIG. 17 is a schematic cross-sectional view and illustrates a shape of the second protective film formed on a bar-like multilayer substrate according to the embodiment.

FIG. 15 is a schematic perspective view, and FIG. 16 is a schematic cross-sectional view. FIGS. 15 and 16 illustrate the step of forming second protective film 132 on bar-like multilayer substrates 12 according to the embodiment. FIG. 16 is a cross-sectional view of bar-like multilayer substrates 12 taken along arrows XVI-XVI illustrated in FIG. 15. FIG. 17 is a schematic cross-sectional view and illustrates a shape of second protective film 132 formed on bar-like multilayer substrate 12 according to the embodiment. The cross section illustrated in FIG. 17 is similar to that illustrated in FIG. 16.

As illustrated in FIGS. 15 and 16, in this step, the principal planes of each of bar-like multilayer substrates 12 are interposed between spacers 900, and second protective film 132 is formed on cleaved end faces 121 formed in the cleaving step by, for example, sputtering. It should be noted that in FIG. 16, semiconductor layer 100 is not illustrated for the sake of simplicity. However, semiconductor layer 100 is disposed on the end portion of bar-like substrate 22 near p-side bottom electrode 151.

As described above, in this step, second protective film 132 is formed on cleaved end faces 121 of bar-like multilayer substrates 12. However, as illustrated in FIG. 16, a space is present between bar-like multilayer substrate 12 and spacer 900. Thus, as illustrated in FIG. 17, second protective film 132 is not only formed on cleaved end face 121, but also continuously formed on the side of p-side top electrode 152, the top of p-side bottom electrode 151, and the side of n-side electrode 160 that are formed above or on bar-like substrate 22. The configuration of second protective film 132 is not limited to a particular configuration. The method of forming second protective film 132 is not limited to a particular method.

[2-9. Step of Forming Third Trench]

The step of forming the third trenches is described. In this step, the third trenches are formed in second surface P2 of bar-like substrate 22 formed in the cleaving step. Hereinafter, the step of forming the third trenches is described with reference to the Drawings.

Figure 18:
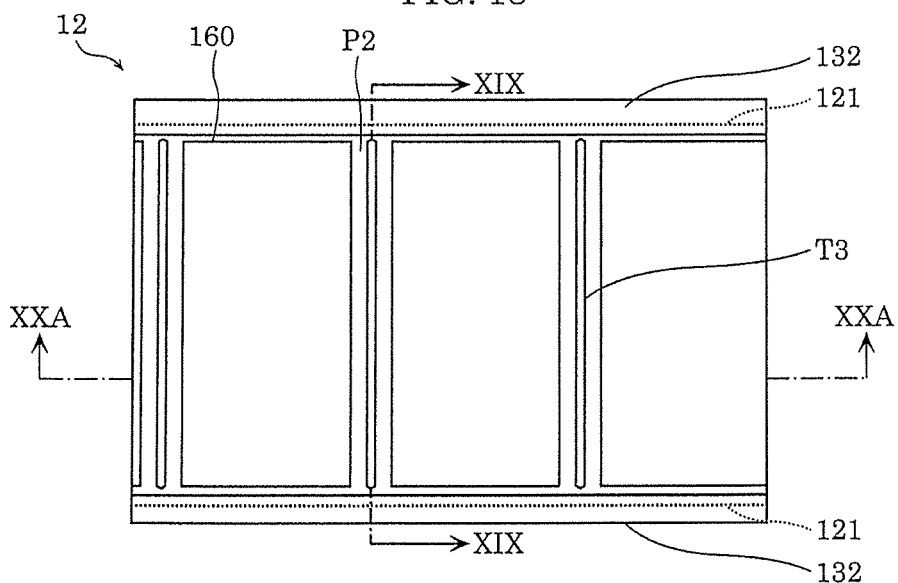
FIG. 18 is a schematic plan view of third trenches formed in the bar-like substrate according to the embodiment.
Figure 19:
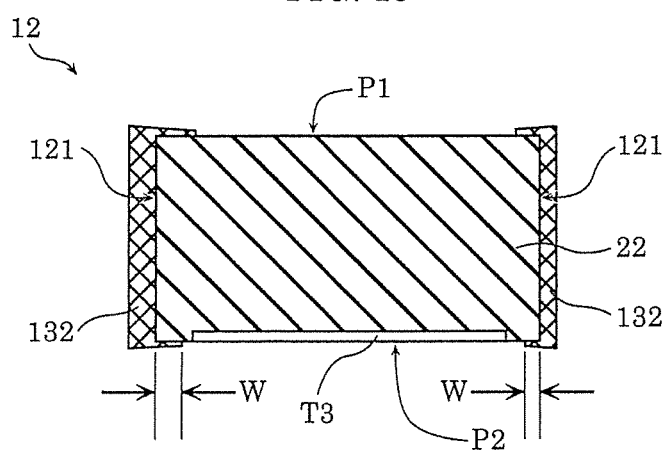
FIG. 19 is a first schematic cross-sectional view of the third trench formed in the bar-like substrate according to the embodiment.
Figure 20A:
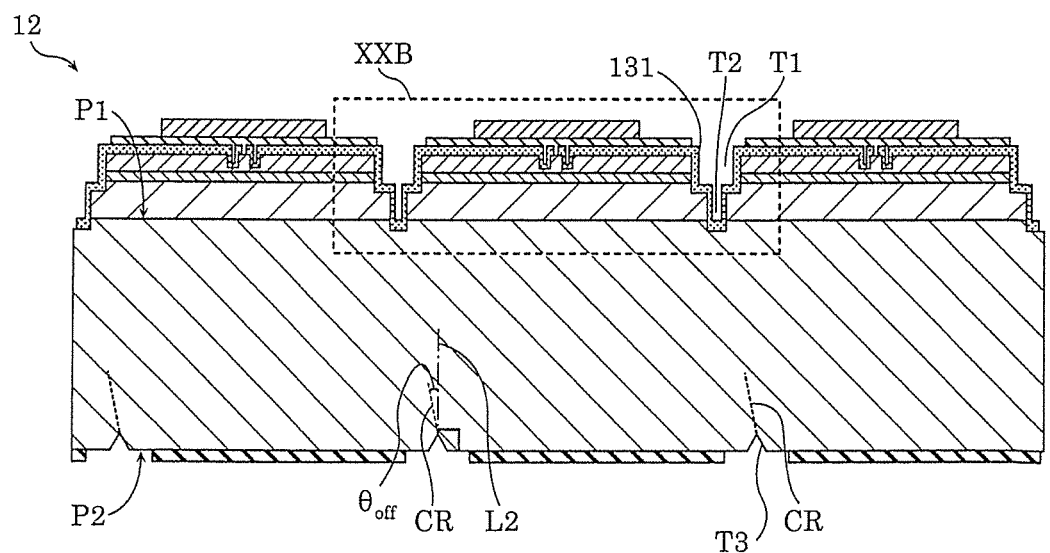
FIG. 20A is a second schematic cross-sectional view of the third trenches formed in the bar-like substrate according to the embodiment.
Figure 20B:
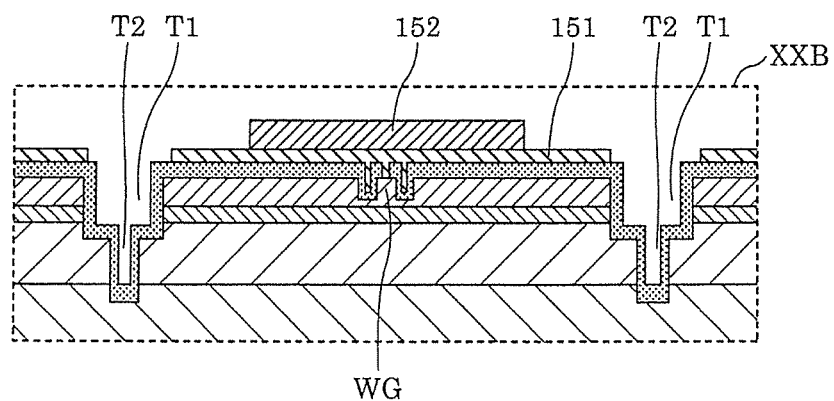
FIG. 20B is a partially enlarged view of FIG. 20A and a cross-sectional view of the bar-like substrate according to the embodiment.

FIG. 18 is a schematic plan view of third trenches T3 formed in bar-like substrate 22 according to the embodiment. FIG. 18 is a plan view of second surface P2 of bar-like substrate 22. FIG. 19 is a first schematic cross-sectional view of third trench T3 formed in bar-like substrate 22 according to the embodiment. FIG. 20A is a second schematic cross-sectional view of third trenches T3 formed in bar-like substrate 22 according to the embodiment. FIG. 19 is a cross-sectional view of third trench T3 taken along arrows XIX-XIX illustrated in FIG. 18. FIG. 20A is a cross-sectional view of third trenches T3 taken along arrows XXA-XXA illustrated in FIG. 18. FIG. 20B is a partially enlarged view of FIG. 20A and a cross-sectional view of bar-like substrate 22 according to the embodiment. FIG. 20B is an enlarged view of the portion inside dashed frame XXB illustrated in FIG. 20A.

As illustrated in FIG. 20A, in this step, third trenches T3 are formed parallel to first trenches T1, in second surface P2 of bar-like substrate 22. In addition, in this step, third trenches T3 are formed by using mechanical scribe lines drawn on the substrate. Thus, as illustrated in FIG. 20A, cracks CR extending from the bottoms of third trenches T3 are formed along the crystal planes of bar-like substrate 22. Because of the existence of cracks CR, bar-like substrate 22 can be cleaved along the crystal planes of bar-like substrate 22. Meanwhile, when forming third trenches T3 by, for example, laser scribing or dry etching, crystal plane-independent trenches are formed, which makes it difficult to form cracks CR. It should be noted that in the example illustrated in FIG. 20A, bar-like substrate 22 has crystal planes having off-angle θoff relative to normal line L2 to second surface P2 in the second direction perpendicular to the first direction, the second direction being parallel to a principal plane of the substrate. Thus, cracks CR are formed along the crystal planes inclined at an angle of θoff degrees relative to normal line L2.

In addition, as illustrated in FIGS. 18 and 19, end portions of third trench T3 are apart from cleaved end faces 121 and do not reach cleaved end faces 121. This can suppress second protective film 132 from peeling and bar-like substrate 22 from breaking although such peeling and breaking can be caused when third trench T3 reaches cleaved end face 121. In addition, in this step, the end portions of third trench T3 are apart from second protective film 132 and do not reach second protective film 132. Thus, even when second protective film 132 is formed on second surface P2 of bar-like substrate 22, it is possible to suppress second protective film 132 from peeling.

[2-10. Step of Dividing Substrate]

The step of dividing bar-like substrate 22 is described. In this step, bar-like substrate 22 is divided along third trenches T3 formed in the step of forming third trenches T3. Hereinafter, the step of dividing bar-like substrate 22 is described with reference to the Drawings.

Figure 21:
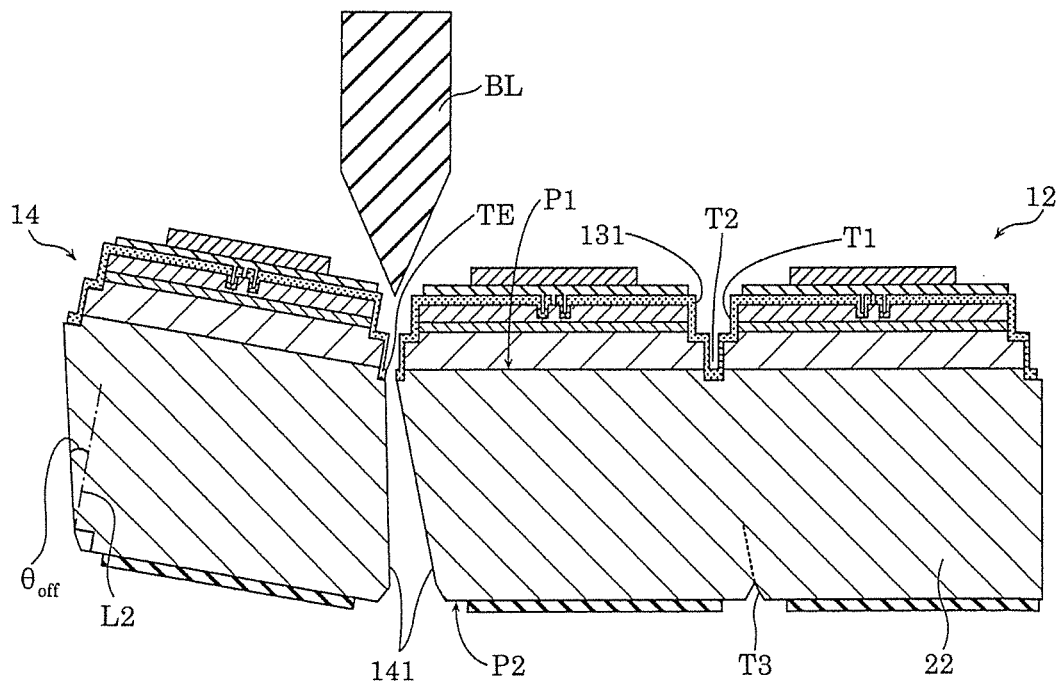
FIG. 21 is a schematic cross-sectional view and illustrates the step of dividing the bar-like substrate according to the embodiment.

FIG. 21 is a schematic cross-sectional view and illustrates the step of dividing bar-like substrate 22 according to the embodiment. The cross section illustrated in FIG. 21 is similar to that illustrated in FIG. 20A.

As illustrated in FIG. 21, in this step, semiconductor laser device 14 is formed by dividing bar-like substrate 22. Semiconductor laser device 14 is an example of a chip-like semiconductor light-emitting device. In the embodiment, in this step, bar-like substrate 22 is divided by pushing blade BL against first surface P1 of bar-like substrate 22. This enables crack CR formed along the crystal plane described above to further extend toward second trench T2. That is, as described above, bar-like substrate 22 has the crystal planes having off-angle θoff in the second direction. In this step, divided side 141 of semiconductor laser device 14 is formed by cleaving bar-like substrate 22 along the crystal plane of bar-like substrate 22. Thus, crack CR becomes deeper along the crystal plane of bar-like substrate 22, which enables division of bar-like substrate 22 in a clear straight line from third trench T3 to second trench T2. Accordingly, it is possible to suppress scraps of bar-like substrate 22 from generating during the division, which can suppress negative effects of the scraps on the semiconductor laser device.

As described above, an end of at least one divided side 141 of semiconductor laser device 14 is in second trench T2. Thus, it is possible to divide bar-like substrate 22 at a desired position. Hereinafter, while comparing with a comparison example, effects of the existence of an end of divided side 141 in second trench T2 are described with reference to the Drawings.

Figure 22:
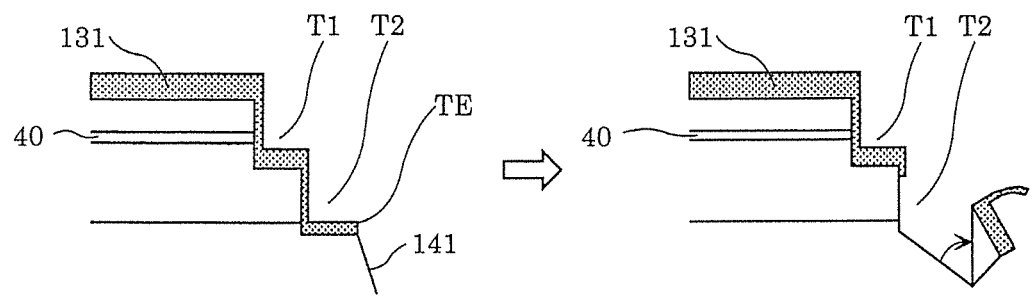
FIG. 22 schematically illustrates the states of a divided side during the performance of a fabrication method according to the embodiment.
Figure 23:
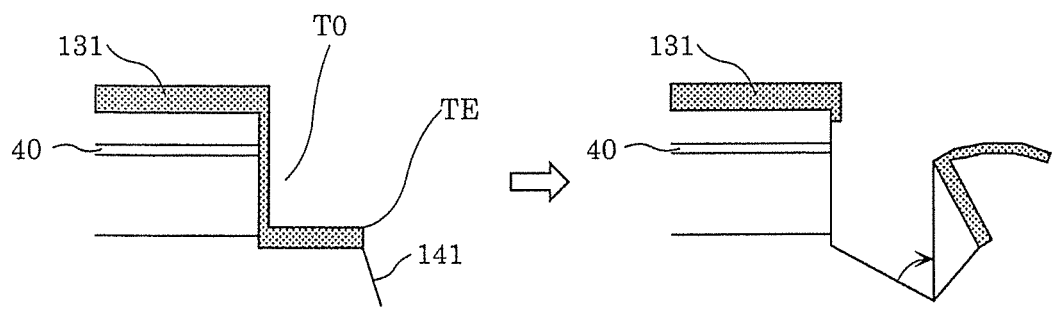
FIG. 23 schematically illustrates the states of a divided side during the performance of a fabrication method in a comparison example.

FIG. 22 schematically illustrates the states of divided side 141 during the performance of the fabrication method according to the embodiment. FIG. 23 schematically illustrates the states of divided side 141 during the performance of a fabrication method in the comparison example.

As illustrated in the left view of FIG. 22, during the performance of the fabrication method according to the embodiment, end TE of divided side 141 is in second trench T2. Thus, for example, as illustrated in the right view of FIG. 22, even if end TE of divided side 141 breaks during the division of bar-like substrate 22, a portion of first protective film 131 that peels due to the breaking of end TE is mostly just first protective film 131 inside second trench T2. Thus, in the step of dividing bar-like substrate 22, it is possible to suppress first protective film 131 formed on the side of light-emitting layer 40 in first trench T1 from peeling.

Such an effect becomes more significant when relationship (1) or relationship (2), which is described above, regarding the film thickness of first protective film 131 is satisfied. That is, when relationship (1) is satisfied, T1$t$ is greater than T2$s$, T1$t$ denoting the film thickness of first protective film 131 on bottom T11 of first trench T1, and T2$s$ denoting the film thickness of first protective film 131 on side T22 of second trench T2. Thus, when force is applied to first protective film 131, first protective film 131 is divided along the border between first protective film 131 on bottom T11 and first protective film 131 on side T22. Thus, it is possible to suppress first protective film 131 on bottom T11 from peeling. Accordingly, it is possible to suppress first protective film 131 on the side of light-emitting layer 40 at side T12 from peeling due to the peeling of first protective film 131 on bottom T11.

In addition, when relationship (2) is satisfied, a difference between T1$t$ and T2$s$ becomes the largest, T1$t$ denoting the film thickness of first protective film 131 on bottom T11 of first trench T1 and T2$s$ denoting the film thickness of first protective film 131 on side T22 of second trench T2. Thus, even if first protective film 131 in second trench T2 peels due to application of force to first protective film 131, it is possible to stop first protective film 131 from further peeling in bottom T11.

Meanwhile, in the fabrication method in the comparison example illustrated in the left view of FIG. 23, only trench T0 is formed. In this case, for example, as illustrated in the right view of FIG. 23, when end TE of divided side 141 breaks during the division of bar-like substrate 22, a portion of first protective film 131 that is likely to peel due to the breaking of end TE is first protective film 131 on the side of trench T0. Thus, first protective film 131 on the side of light-emitting layer 40 is likely to peel.

As described above, in this step, it is possible to suppress first protective film 131 on the side of light-emitting layer 40 from peeling.

Variation

A variation of the embodiment is described below. The variation differs from the embodiment in the configuration of the first protective film. The other elements in the variation and the embodiment have the same configurations. Hereinafter, the following focuses on differences between the variation and the embodiment with reference to FIGS. 24 to 26.

Figure 24:
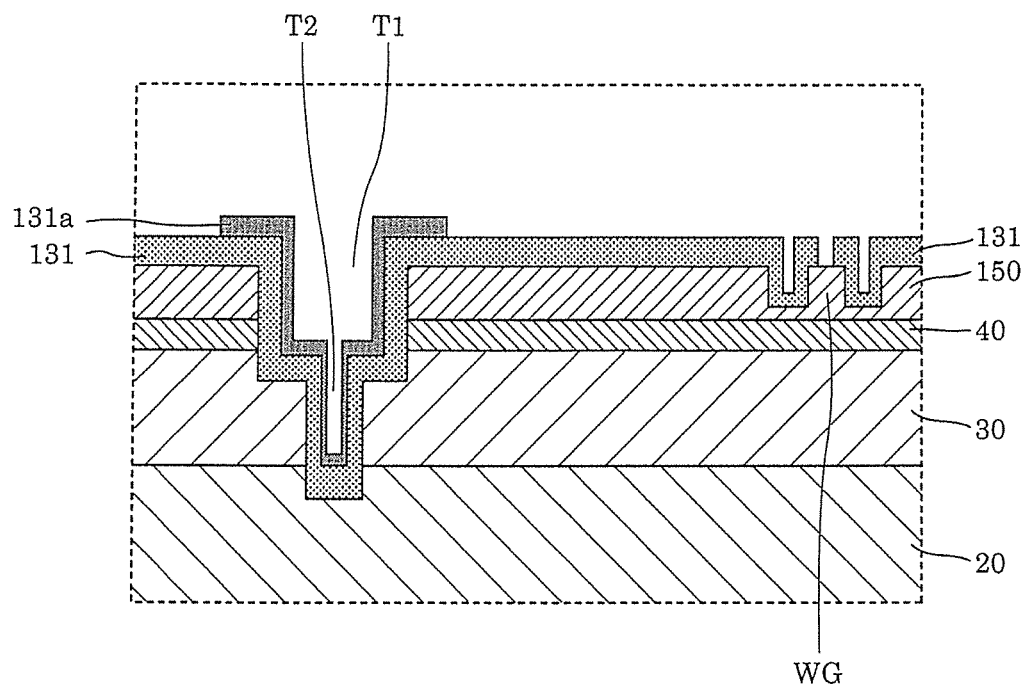
FIG. 24 is a schematic partially-enlarged cross-sectional view of a substrate and illustrates the outline of the step of forming a first protective film according to a variation.
Figure 25:
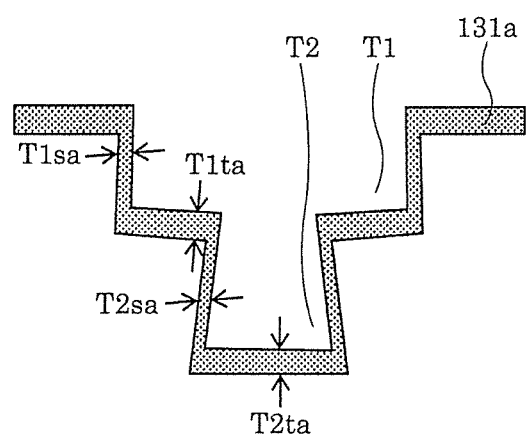
FIG. 25 schematically illustrates the dimensions of the first protective film on a first trench and a second trench according to the variation.
Figure 26:
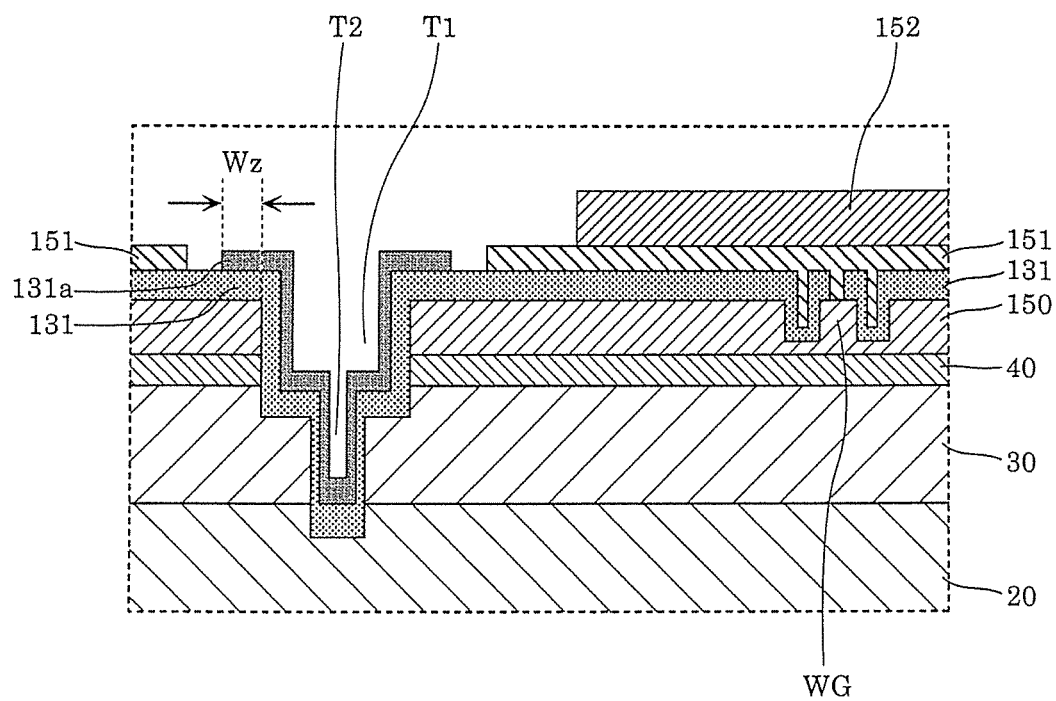
FIG. 26 is a partially-enlarged cross-sectional view of a bar-like substrate according to the variation.

FIG. 24 is a schematic partially-enlarged cross-sectional view of substrate 20 and illustrates the outline of the step of forming a first protective film according to the variation. The cross section illustrated in FIG. 24 is similar to that illustrated in FIG. 10B in the embodiment. FIG. 25 schematically illustrates the dimensions of first protective film 131$a$ on first trench T1 and second trench T2 according to the variation. FIG. 26 is a partially-enlarged cross-sectional view of a bar-like substrate according to the variation. The cross section illustrated in FIG. 26 is similar to that illustrated in FIG. 20B in the embodiment.

As illustrated in FIG. 24, the first protective film according to the variation has a multilayer structure. In the example illustrated in FIG. 24, the first protective film has the two layers of first protective film 131 and first protective film 131$a$. First protective film 131 according to the variation has the same configuration of that according to the embodiment. First protective film 131$a$ according to the variation is disposed in at least first trench T1 and second trench T2. Thus, since the first protective film has the multilayer structure in first trench T1 and second trench T2, the first protective film in first trench T1 and second trench T2 becomes thicker. That is, it is possible to suppress the first protective film in first trench T1 and second trench T2 from becoming excessively thin. Thus, when dividing substrate 20 along second trench T2, it is possible to suppress the first protective film on the sides of first trench T1 and the sides of second trench T2 from peeling.

It should be noted that to obtain such an effect, increasing of the overall film thickness of first protective film 131 may be considered. However, in this case, the film thickness of first protective film 131 near waveguide WG (that is, near a ridge portion) also increases. Thus, stress applied to waveguide WG changes from when first protective film 131 has a small thickness. The characteristics of a laser beam from a semiconductor light-emitting device change as stress applied to waveguide WG changes. Thus, by increasing the overall film thickness of first protective film 131, a laser beam having expected characteristics may not be obtained from a semiconductor light-emitting device. Meanwhile, by forming first protective film 131$a$ according to the variation only in first trench T1, second trench T2, and portions near first trench T1 and second trench T2, it is possible to suppress the first protective film from peeling without changing the characteristics of a laser beam from a semiconductor light-emitting device.

As in the case of first protective film 131, first protective film 131$a$ covers bottom T11 and sides T12 of first trench T1 and bottom T21 and sides T22 of second trench T2. As in the case of the embodiment, T1$t$ denotes the film thickness of first protective film 131 on bottom T11 of first trench T1, and T2$s$ denotes the film thickness of first protective film 131 on sides T22 of second trench T2. As illustrated in FIG. 25, T1$ta$ denotes the film thickness of first protective film 131$a$ on bottom T11 of first trench T1, and T2$sa$ denotes the film thickness of first protective film 131$a$ on sides T22 of second trench T2. Then, the following relationship (3) is satisfied.

$$T1t+T1ta>T2s+T2sa \qquad (3)$$

In addition, as in the case of the embodiment, T1$s$ denotes the film thickness of first protective film 131 on sides T12 of first trench T1, and T2$t$ denotes the film thickness of first protective film 131 on bottom T21 of second trench T2. T1sa denotes the film thickness of first protective film 131a on sides T12 of first trench T1, and T2ta denotes the film thickness of first protective film 131a on bottom T21 of second trench T2. Then, the following relationship (4) is satisfied.

$$T1t+T1ta \geq T2t+T2ta > T1s+T1sa \geq T2s+T2sa \quad (4)$$

That is, even when the first protective film has the multilayer structure, relations regarding the overall thickness of the first protective film are similar in the variation and the embodiment. Thus, effects similar to those of the embodiment are obtained in the variation. In addition, in the variation, regarding the film thickness of first protective film 131a, the following relationships (5) and (6) may be satisfied.

$$T1ta > T2sa \quad (5)$$

$$T1ta \geq T2ta > T1sa \geq T2sa \quad (6)$$

Thus, effects similar to those of the embodiment are obtained in the variation.

In addition, as illustrated in FIG. 26, first protective film 131a according to the variation may be formed apart from p-side bottom electrode 151 disposed on first protective film 131. That is, first protective film 131a may be formed so as not to be in contact with p-side bottom electrode 151. This means that width Wz of a portion of first protective film 131a disposed outside first trench T1 may be less than the distance from first trench T1 to p-side bottom electrode 151. Here, width Wz denotes the width of first protective film 131a in a plane perpendicular to the longitudinal direction of first trench T1. Thus, by disposing first protective film 131a so as not to be in contact with p-side bottom electrode 151, it is possible to suppress p-side bottom electrode 151 from peeling easily. In the variation, width Wz approximately ranges from 1 μm to 3 μm.

As long as first protective film 131a is a dielectric film as in the case of first protective film 131, the material of the film is not limited to a particular material. First protective film 131a may be made of, for example, $SiO_2$, SiN, $TiO_2$, $ZrO_2$, $Al_2O_3$, $Nb_2O_5$, or $Ta_2O_5$. First protective film 131a may be made of the same material as first protective film 131. That is, the first protective film does not have to have a multilayer structure and may be thicker in first trench T1 and second trench T2 than in the other portions. In addition, first protective film 131a can be formed in the same way as first protective film 131.

First protective film 131a is thinner than first protective film 131. Thus, it is possible to suppress the first protective film from becoming excessively thick, which can suppress increased difficulty in dividing the substrate. The film thickness of first protective film 131a approximately ranges from 100 nm to 200 nm, for example. In the variation, the film thickness of first protective film 131a is around 150 nm.

Other Variations and Supplementary Explanations

The method of fabricating a semiconductor light-emitting device according to the present disclosure and the semiconductor light-emitting device are described above on the basis of the embodiment. However, the present disclosure is not limited to the embodiment.

For instance, the present disclosure covers an embodiment obtained by making various modifications that can be arrived at by those skilled in the art to the embodiment and an embodiment obtained by combining the structural elements and the functions described in the embodiment and the variation without departing from the spirit of the present disclosure.

For instance, the method of fabricating a semiconductor light-emitting device can be used for fabricating a device other than a semiconductor laser device. For instance, a light-emitting diode may be used as a semiconductor light-emitting device. In this case, the cleaving step does not necessarily have to be performed. That is, the method of fabricating a semiconductor light-emitting device according to one aspect of the present disclosure includes: (a) forming semiconductor layer 100 including light-emitting layer 40 on first surface P1 of substrate 20; (b) forming first trench T1 and second trench T2 in semiconductor layer 100, first trench T1 extending in a first direction that is parallel to a principal plane of substrate 20, and second trench T2 being disposed inside and parallel to first trench T1; (c) forming third trench T3 parallel to first trench T1 in second surface P2 of substrate 20 opposite to first surface P1 of substrate 20; and (d) forming a semiconductor light-emitting device by dividing substrate 20. In (d), an end of at least one divided side of the semiconductor light-emitting device is in second trench T2. First trench T1 has first width W1. Second trench T2 has second width W2. Second width W2 is less than first width W1.

In addition, definitions for first width W1 of first trench T1 and second width W2 of second trench T2 described above may be suitably determined. For instance, the width of each trench may be the largest value, the smallest value, or an average value. In addition, a definition for the film thickness of first protective film 131 may be suitably determined. For instance, the film thickness of first protective film 131 may be an average film thickness.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The method of fabricating a semiconductor light-emitting device according to the present disclosure and the semiconductor light-emitting device can be used particularly for fabricating, for example, a semiconductor laser device for semiconductor laser equipment in which a reliable light-emitting layer is used.

What is claimed is:

1. A method of fabricating a semiconductor light-emitting device, the method comprising:
    (a) forming a semiconductor layer including a light-emitting layer on a first surface of a substrate;
    (b) after forming the semiconductor layer, forming a first trench and a second trench in the semiconductor layer, the first trench extending in a first direction that is parallel to a principal plane of the substrate, and the second trench being disposed inside and parallel to the first trench;
    (c) forming a third trench parallel to the first trench in a second surface of the substrate opposite to the first surface of the substrate; and
    (d) forming a semiconductor light-emitting device by dividing the substrate, wherein in (b), the second trench reaches the substrate,
a portion of the substrate removed by forming the second trench has a depth less than or equal to 5 µm,
in (d), an end of at least one divided side of the semiconductor light-emitting device is in the second trench,
the first trench has a first width,
the second trench has a second width, and
the second width is less than the first width.

2. The method of fabricating a semiconductor light-emitting device according to claim 1,
wherein in (a), the semiconductor layer is formed by sequentially forming a first semiconductor layer, the light-emitting layer, and a second semiconductor layer from a side on which the substrate is present, the first semiconductor layer including a first conductivity type layer, and the second semiconductor layer including a second conductivity type layer, and
in (b), the first trench reaches the first semiconductor layer.

3. The method of fabricating a semiconductor light-emitting device according to claim 2, the method further comprising:
(e) forming a first protective film on sides of the light-emitting layer in the first trench before performing (d).

4. The method of fabricating a semiconductor light-emitting device according to claim 3, wherein the first protective film covers at least sides of the first trench.

5. The method of fabricating a semiconductor light-emitting device according to claim 3,
wherein the first protective film covers a bottom of the first trench and sides of the second trench, and
$T1t > T2s$ is satisfied, where $T1t$ denotes a film thickness of the first protective film on the bottom of the first trench, and $T2s$ denotes a film thickness of the first protective film on the sides of the second trench.

6. The method of fabricating a semiconductor light-emitting device according to claim 5, wherein $T1t \geq T2t > T1s \geq T2s$ is satisfied, where $T1s$ denotes a film thickness of the first protective film on sides of the first trench, and $T2t$ denotes a film thickness of the first protective film on a bottom of the second trench.

7. The method of fabricating a semiconductor light-emitting device according to claim 1,
wherein the first surface has an off-angle relative to a crystal plane of the substrate in a second direction perpendicular to the first direction, the second direction being parallel to the principal plane of the substrate, and
in (d), a divided side of the semiconductor light-emitting device is formed by cleaving the substrate along a crystal plane of the substrate.

8. The method of fabricating a semiconductor light-emitting device according to claim 1, wherein in (c), the third trench is formed by using a mechanical scribe line drawn on the substrate.

9. The method of fabricating a semiconductor light-emitting device according to claim 8, wherein in (c), a crack extending from a bottom of the third trench is formed along a crystal plane of the substrate.

10. The method of fabricating a semiconductor light-emitting device according to claim 1, wherein in (d), the substrate is divided by pushing a blade against the first surface of the substrate.

11. The method of fabricating a semiconductor light-emitting device according to claim 1, wherein in (b), the first trench is formed by dry etching, and the second trench is formed by dry etching after forming the first trench.

12. The method of fabricating a semiconductor light-emitting device according to claim 1, wherein a side of the first trench and a side of the second trench are inclined at an angle of 85 degrees to 95 degrees relative to the second surface of the substrate.

13. The method of fabricating a semiconductor light-emitting device according to claim 1, wherein the second trench has a width less than or equal to 10 µm.

14. The method of fabricating a semiconductor light-emitting device according to claim 1, wherein the first trench has a bottom, and the second trench extends from the bottom of the first trench.

15. The method of fabricating a semiconductor light-emitting device according to claim 1, the method further comprising:
cleaving the substrate along a second direction perpendicular to the first direction to form a bar-like substrate having a cleaved end face before performing (c), the second direction being parallel to the principal plane of the substrate,
wherein in (c), the third trench is formed in a surface of the bar-like substrate corresponding to a portion of the second surface of the substrate,
in (d), the semiconductor light-emitting device is formed by dividing the bar-like substrate, and the semiconductor layer has a plurality of waveguides extending in the first direction, and
in (b), the first trench is formed between waveguides next to each other among the plurality of waveguides.

16. The method of fabricating a semiconductor light-emitting device according to claim 15, wherein in (c), the third trench is apart from the cleaved end face.

17. The method of fabricating a semiconductor light-emitting device according to claim 16, the method further comprising:
(f) forming a second protective film on the cleaved end face,
wherein the second protective film is continuously formed from the cleaved end face to the first surface to the second surface, and
in (c), the third trench is apart from the second protective film.

18. A method of fabricating a semiconductor light-emitting device, the method comprising:
(a) forming a semiconductor layer including a light-emitting layer on a first surface of a substrate;
(b) forming a first trench and a second trench in the semiconductor layer, the first trench extending in a first direction that is parallel to a principal plane of the substrate, and the second trench being disposed inside and parallel to the first trench;
cleaving the substrate along a second direction perpendicular to the first direction to form a bar-like substrate having a cleaved end face after performing (b), the second direction being parallel to the principal plane of the substrate;
(c) forming a third trench parallel to the first trench in a second surface of the bar-like substrate opposite to a surface of the bar-like substrate corresponding to a portion of the first surface of the substrate after performing the cleaving; and
(d) forming a semiconductor light-emitting device by dividing the bar-like substrate,
wherein in (a), the semiconductor layer has a plurality of waveguides extending in the first direction,
in (b), the first trench is formed between waveguides next to each other among the plurality of waveguides, in (d), an end of at least one divided side of the semiconductor light-emitting device is in the second trench, the first trench has a first width, the second trench has a second width, and the second width is less than the first width.

19. The method of fabricating a semiconductor light-emitting device according to claim 18, wherein in (c), the third trench is apart from the cleaved end face.

20. A semiconductor light-emitting device comprising:
a chip-like substrate; and
a semiconductor layer disposed on a first surface of the chip-like substrate and including a light-emitting layer,
wherein a portion including a side of the semiconductor layer has a first step and a second step,
the first step has a first side and a first bottom, the first side including a side of the light-emitting layer, and the first bottom being connected to an end portion of the first side near the chip-like substrate and extending in a direction that intersects the first side,
the second step has a second side and a second bottom, the second side being connected to an end portion of the first bottom far from the first side and extending in a direction from the semiconductor layer toward the chip-like substrate, and the second bottom being connected to an end portion of the second side far from the first bottom and extending in a direction that intersects the second side,
the second bottom is in the chip-like substrate, and
a distance between the second bottom and a plane including the first surface in a normal direction is less than or equal to 5 μm.

21. The semiconductor light-emitting device according to claim 20, further comprising:
a first protective film disposed on the first step and the second step,
wherein $T1t > T2s$ is satisfied, where $T1t$ denotes a film thickness of the first protective film on the first bottom, and $T2s$ denotes a film thickness of the first protective film on the second side.

22. The semiconductor light-emitting device according to claim 20,
wherein the chip-like substrate includes a second surface opposite to the first surface of the chip-like substrate, and
the first side and the second side are each inclined at an angle of 85 degrees to 95 degrees relative to the second surface.

* * * * *